United States Patent
Bhuwalka

(10) Patent No.: US 8,723,223 B2
(45) Date of Patent: May 13, 2014

(54) HYBRID FIN FIELD-EFFECT TRANSISTORS

(75) Inventor: Krishna Kumar Bhuwalka, Asansol (IN)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 98 days.

(21) Appl. No.: 13/463,869

(22) Filed: May 4, 2012

(65) Prior Publication Data

US 2013/0134522 A1 May 30, 2013

Related U.S. Application Data

(63) Continuation-in-part of application No. 13/307,738, filed on Nov. 30, 2011.

(51) Int. Cl.
*H01L 29/66* (2006.01)

(52) U.S. Cl.
USPC .................................. 257/192; 257/E29.255

(58) Field of Classification Search
USPC .......................................... 257/192, E29.255
See application file for complete search history.

(56) References Cited

U.S. PATENT DOCUMENTS

| | | | |
|---|---|---|---|
| 6,787,406 B1 | 9/2004 | Hill et al. | |
| 6,914,277 B1 | 7/2005 | Hill et al. | |
| 6,974,983 B1 | 12/2005 | Hill et al. | |
| 7,129,550 B2 * | 10/2006 | Fujiwara et al. | 257/401 |
| 7,187,046 B2 * | 3/2007 | Wu et al. | 257/412 |
| 7,719,059 B2 | 5/2010 | Hofmann et al. | |
| 8,222,680 B2 | 7/2012 | Lin et al. | |
| 8,471,329 B2 * | 6/2013 | Bhuwalka et al. | 257/327 |
| 8,604,518 B2 | 12/2013 | Bhuwalka et al. | |
| 2005/0073005 A1 | 4/2005 | Nowak et al. | |
| 2006/0255410 A1 | 11/2006 | Bernstein et al. | |
| 2007/0090416 A1 * | 4/2007 | Doyle et al. | 257/288 |
| 2013/0102116 A1 | 4/2013 | Xiao et al. | |

FOREIGN PATENT DOCUMENTS

| | | |
|---|---|---|
| KR | 1020070035492 | 3/2007 |
| KR | 101060279 | 8/2011 |
| WO | 2004038808 | 5/2004 |

OTHER PUBLICATIONS

Radosavljevic, M., et al., "Electrostatics Improvement in 3-D Trigate Over Ultra-Thin Body Planar InGaAs Quantum Well Field Effect Transistors with High-K Gate Dielectric and Scaled Gate-to-Drain/Gate-to-Source Separation," 2011 IEEE International Electron Devices Meeting (IEDM), Dec. 5-7, 2011, pp. 33.1.1-33.1.4.

(Continued)

*Primary Examiner* — Lex Malsawma
(74) *Attorney, Agent, or Firm* — Slater and Matsil, L.L.P.

(57) ABSTRACT

A hybrid Fin Field-Effect Transistor (FinFET) includes a first and a second FinFET. The first FinFET includes a first channel region formed of a first semiconductor fin, and a first source region and a first drain region of a first conductivity type. The second FinFET includes a second channel region formed of a second semiconductor fin, a second source region of a second conductivity type opposite the first conductivity type, and a second drain region of the first conductivity type. The second source region and the second drain region are connected to opposite ends of the second channel region. The first and the second gate electrodes are interconnected. The first and the second source regions are electrically interconnected. The first and the second drain regions are electrically interconnected.

20 Claims, 19 Drawing Sheets

(56) References Cited

OTHER PUBLICATIONS

Radosavljevic, M., et al., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications," 2010 IEEE International Electron Devices Meeting (IEDM), Dec. 6-8, 2010, pp. 6.1.1-6.1.4.

* cited by examiner

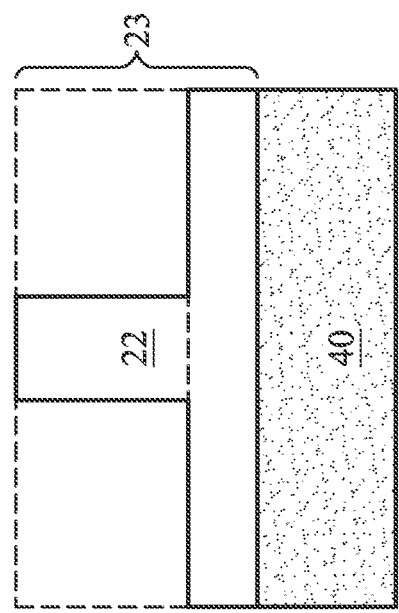

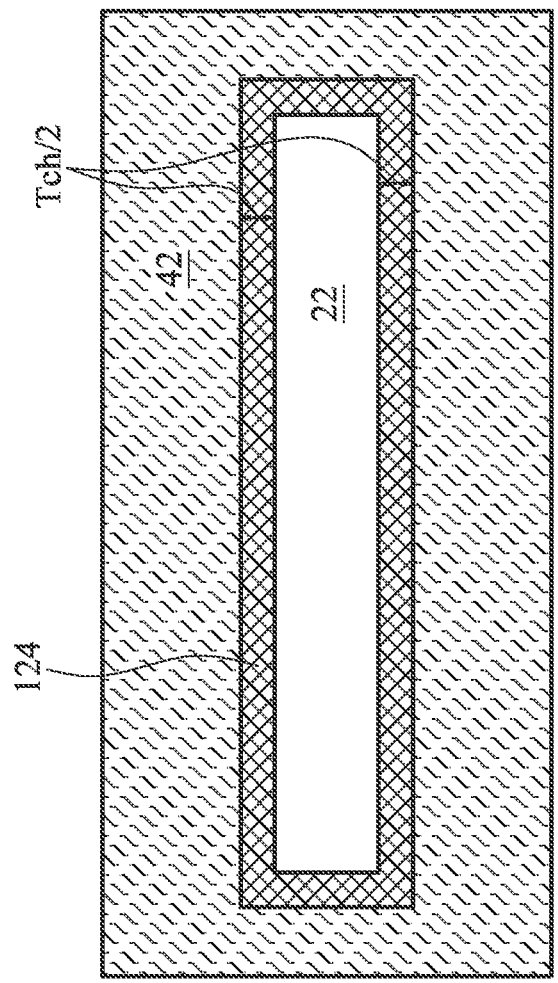
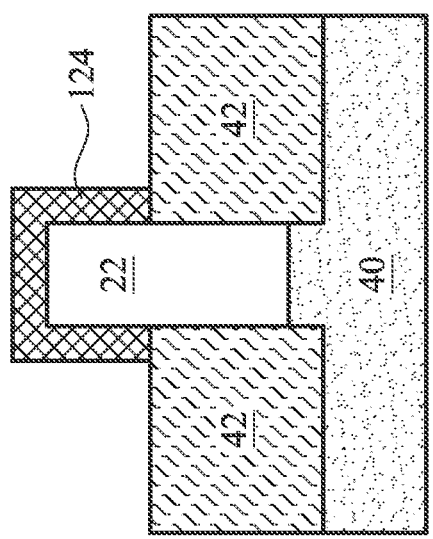
Fig. 7B
Fig. 7A

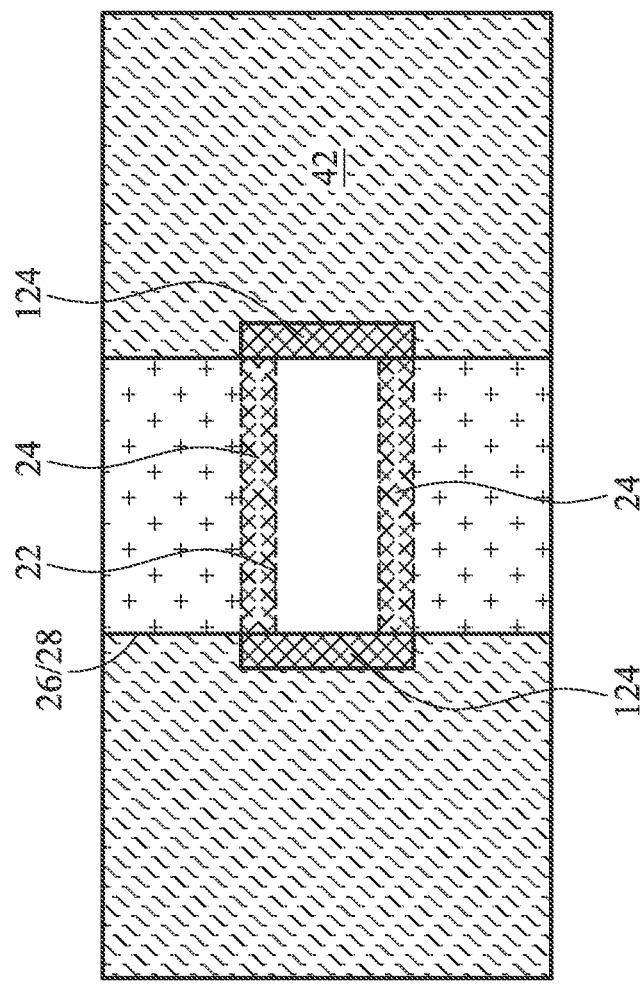

HYBRID FIN FIELD-EFFECT TRANSISTORS

This application is a continuation-in-part of the following commonly-assigned U.S. patent application: application Ser. No. 13/307,738, filed Nov. 30, 2011, and entitled "Split-Channel Transistor and Methods for Forming the Same;" which application is hereby incorporated herein by reference.

BACKGROUND

The drive currents of transistors are related to the mobility of the carriers in the channel regions of the transistors. Therefore, by increasing the mobility of the carriers, the drive currents of transistors may be improved.

III-V compound semiconductor materials have high mobility values. Accordingly, the transistors using III-V compound semiconductor materials are being researched. However, due to the narrow bandgap of the III-V compound semiconductor materials, the source-to-drain leakage currents of the resulting transistors are also high.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3 through 8B are intermediate stages in the manufacturing of the FinFET shown in FIG. 2 in accordance with some embodiments;

FIGS. 9 and 10 are intermediate stages in the manufacturing of the FinFET shown in FIG. 1A in accordance with some embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A Fin Field-Effect Transistor (FinFET) and the method of forming the same are provided in accordance with various embodiments. The intermediate stages of forming the FinFET are illustrated. The variations and the operation of the embodiments are discussed. Throughout various views and illustrative embodiments, like reference numbers are used to designate like elements.

Figure 1A:
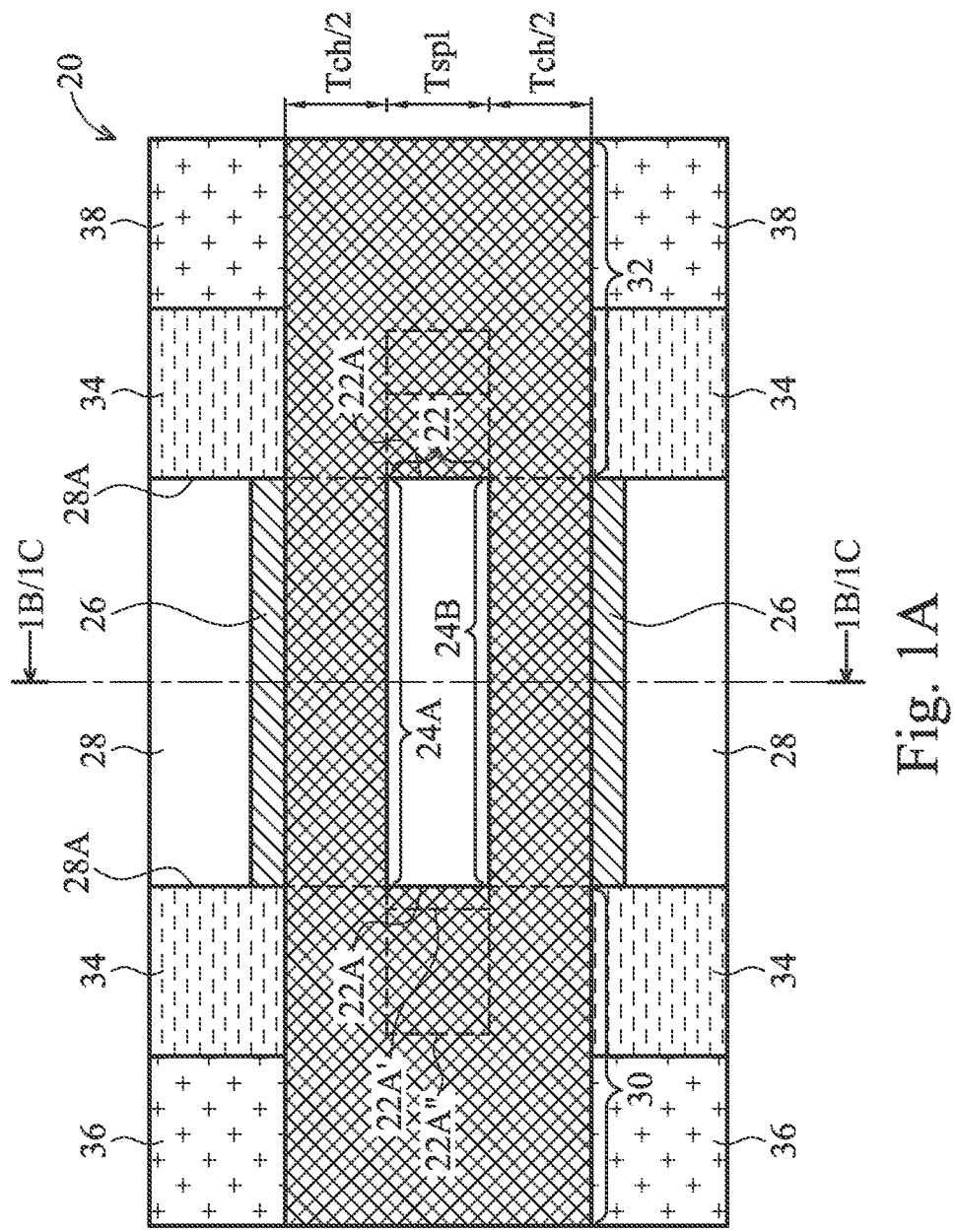
FIGS. 1A through 2 are cross-sectional views and top views of Fin Field-Effect Transistors (FinFETs) in accordance with various embodiments.
Figure 1C:
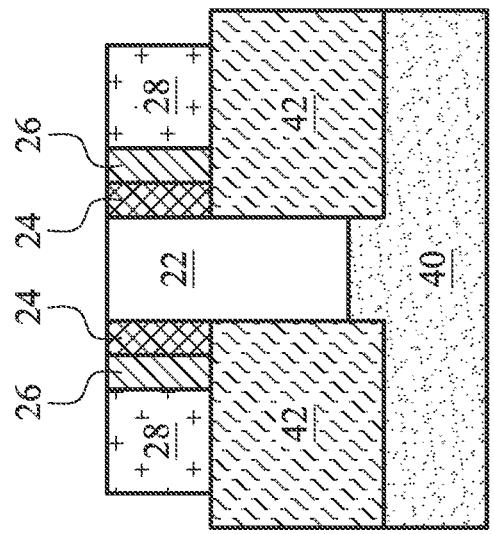
Figure 1B:
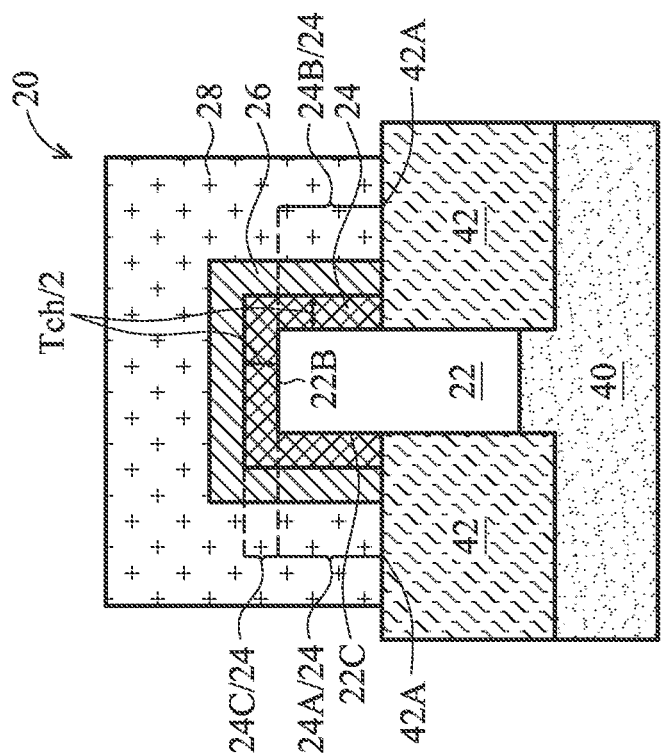

FIG. 1A illustrates a top view of an exemplary FinFET 20, in accordance with some embodiments. FinFET 20 includes a channel splitter 22 that splits a channel 24 into portions 24A and 24B on opposite sides of channel splitter 22, as shown in FIGS. 1B and 1C. In some embodiments channel 24 also includes a top portion 24C over channel splitter 22 as shown in FIG. 1B. In both embodiments in FIGS. 1B and 1C, channel 24 is a continuous channel, but, from different top views, channel 24 is shown to have channel portions 24A, 24B, and 24C. For simplicity, channel portions 24A, 24B, and/or 24C are called channel portions 24. In the top view in FIG. 1A, channel portions 24A and 24B are illustratively shown. Gate insulator(s) 26 separate channel portions 24A and 24B from gate electrode(s) 28. Drain region 30 and source region 32 are connected to the left ends and the right ends, respectively, of channel portions 24A and 24B and channel splitter 22. Sidewall spacers 34 are formed on the sidewalls of gate electrode 28. Drain contacts 36 and source contacts 38 are electrically coupled to drain region 30 and source region 32, respectively.

FIG. 1B illustrates a cross-sectional view of FinFET 20 in accordance with some exemplary embodiments, wherein the cross-sectional view is taken from the plane crossing line 1B/1C-1B/1C in FIG. 1A. The embodiment shown in FIG. 1B includes a tri-gate transistor. In an exemplary embodiment, FinFET 20 is formed over substrate 40, which may be a silicon substrate, although it may also be other substrates (such as sapphire) that are suitable for forming III-V compound semiconductor materials. Alternatively, substrate 40 is formed of the same material as channel splitter 22, and hence channel splitter 22 may be formed by patterning substrate 40, so that a portion of substrate 40 forms channel splitter 22. Shallow Trench Isolation (STI) regions 42 are formed over a portion of substrate 40. Channel splitter 22 may be a fin that is at a level higher than top surfaces 42A of STI regions 42. Channel portions 24 are formed on the top surface 22B and sidewalls 22C of channel splitter 22. Gate insulator 26 is formed on the top surface 22B and sidewalls 22C of channels 24. In some embodiments, gate insulator 26 may comprise a high-k dielectric material such as $Ta_2O_5$, HfSiO, HfSiON, $HfO_2$, $ZrO_2$, ZrSiO, ZrSiON, TaSiO, or the like. Gate electrode 28 is formed on gate insulator 26. Gate electrode 28 may comprise doped polysilicon, metals, metal silicides, or the like.

FIG. 1C illustrates a cross-sectional view of FinFET 20. It is noted that although FIGS. 1B and FIG. 1C illustrate different embodiments, the top views of the structures in FIGS. 1B and 1C have the same top view as in FIG. 1A. The cross-sectional view shown in FIG. 1C is also taken from the plane crossing line 1B/1C-1B/1C in FIG. 1A. The embodiment shown in FIG. 1C includes a double-gate transistor, wherein fin 24 (which is also channel 24) includes portions on sidewalls of channel splitter 22, and does not extend on the top of channel splitter 22. Furthermore, gate insulators 26 and gate electrodes 28 are formed on the opposite sides of fin 24, and may, or may not, extend to the top of channel splitter 22.

Referring back to FIG. 1A, channel 24 (including channel portions 24A and 24B), source region 32, and drain region 30 of FinFET 20 are formed of low-bandgap materials, which may be low-bandgap III-V compound semiconductor materials. The low-bandgap materials may have bandgaps lower than about 0.75 eV, or lower than about 0.5 eV, for example. Exemplary materials for forming channel 24, source region 32, and drain region 30 include InAs, GaSb, InSb, InGaAs, Ge, and the like. In an exemplary embodiment, InAs, which has a bandgap equal to about 0.36 eV, may be used for forming channel 24, source region 32, and/or drain region 30. Source region 32 and/or drain region 30 may be formed of a same material or different materials.

Channel splitter 22 has a bandgap greater than the bandgaps of channel 24, source region 32, and/or drain region 30. In an exemplary embodiment, the bandgap of channel splitter 22 is great than the bandgaps of channel 24, source region 32, and/or drain region 30 by about 1 eV. In an exemplary embodiment, channel splitter 22 is formed of AlAsSb (such as $AlAs_{0.16}Sb_{0.84}$), which may have a bandgap equal to about 1.84 eV.

In some embodiments, for example, when FinFET 20 is an n-type FinFET, the conduction band of channel splitter 22 is higher than the conduction bands of channels 24, source region 32, and drain region 30, with the conduction band offsets ΔCB (conduction band differences) being greater than about 0.5 eV, or greater than about 1.0 eV.

In the embodiments wherein FinFET 20 is a p-type FinFET, the valence band of channel splitter 22 may also be lower than the valence bands of channels 24, source region 32, and/or drain region 30, with the valence band offset ΔVB (valence band differences) being greater than about 0.5 eV, or greater than about 1.0 eV.

Figure 2:
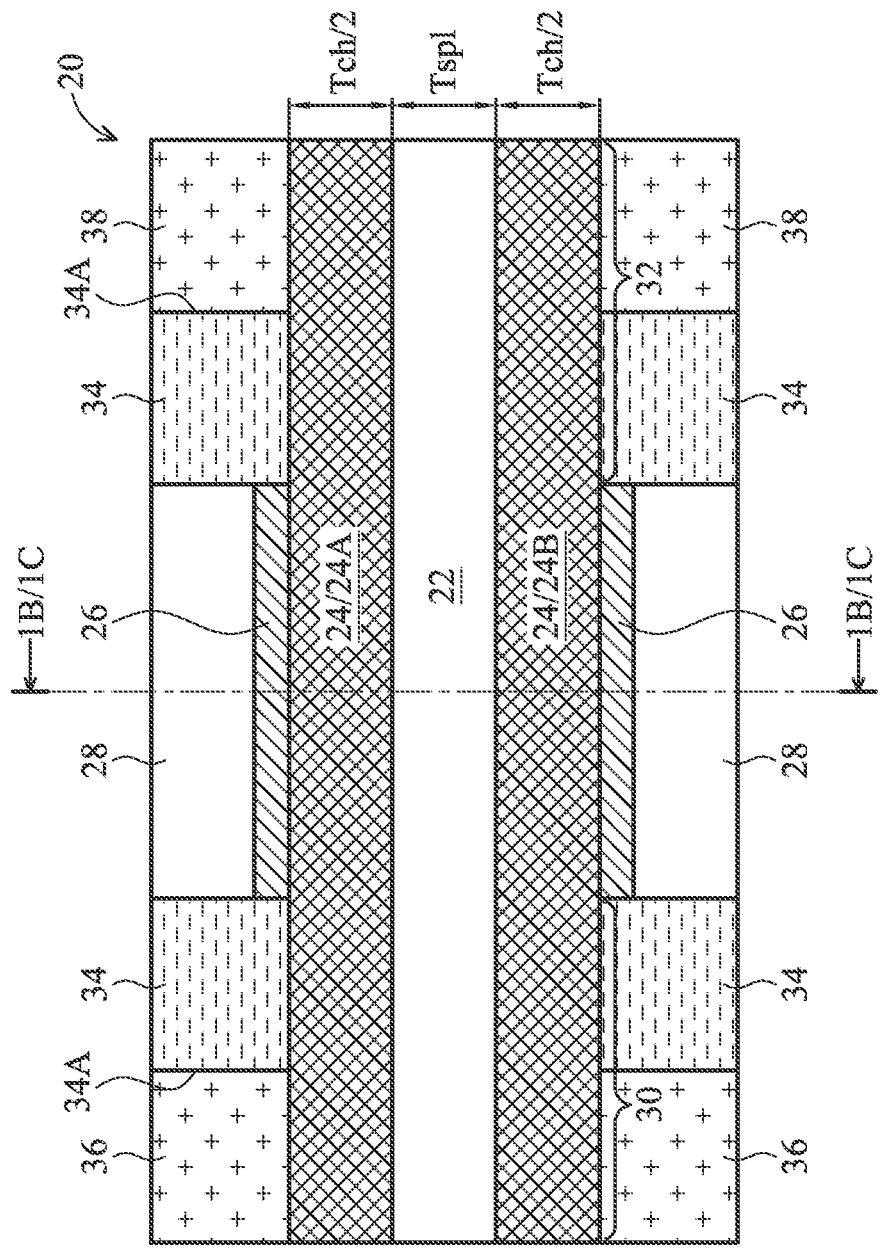

Again referring to FIG. 1A, edges 22A of channel splitter 22 may be substantially aligned to edges 28A of gate electrodes 28. Alternatively, channel splitter 22 may extend into drain region 30 and/or source region 32. FIG. 2 illustrates a top view of FinFET 20 in accordance with various alternative embodiments. The cross-sectional views of FinFET 20 in FIG. 2 are also the same as shown in FIGS. 1B and 1C. These embodiments are essentially the same as the embodiments as shown in FIGS. 1A, 1B, and 1C, except that channel splitter 22 extends into drain region 30 and source region 32. In some embodiments, channel splitter 22 extends beyond outer side edges 34A of sidewalls spacers 34. For example, as shown in FIG. 1A, the ends of channel splitter 22 are located where dashed lines 22A' are, rather than where lines 22A are.

In the embodiments shown in FIGS. 1A and 2, channel 24 has total thickness Tch (which is also the total channel width). Accordingly, the thickness of each of channel portions 24A and 24B is Tch/2. Thickness Tch/2 of channel portions 24A and 24B may be between about 2 nm and about 10 nm, or between about 3 nm and about 7 nm. Thickness Tsp1 of channel splitter 22 may be between about 5 nm and about 20 nm, or between about 8 nm and about 12 nm. It is realized, however, that the dimensions recited throughout the description are merely example, and may be changed to different values.

Figure 4:
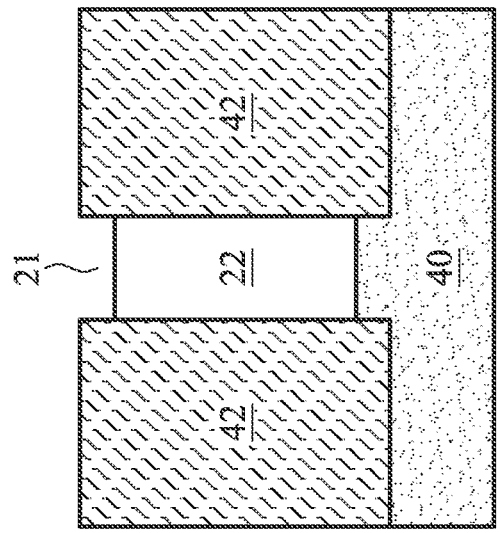
Figure 3:
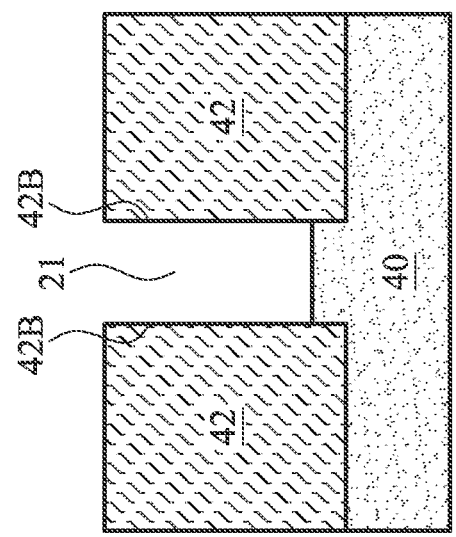

FIGS. 3 through 8B illustrate an exemplary process for forming the structure as shown in FIG. 2. Referring to FIG. 3, STI regions 42 are formed in substrate 40, wherein substrate 40 may be a silicon substrate, for example. Recess 21 is formed by removing a part of substrate 40 between opposite sidewalls 42B of STI regions 42. An epitaxial growth is then performed to epitaxially grow channel splitter 22 in recess 21, and the resulting structure is shown in FIG. 4.

Figure 5B:
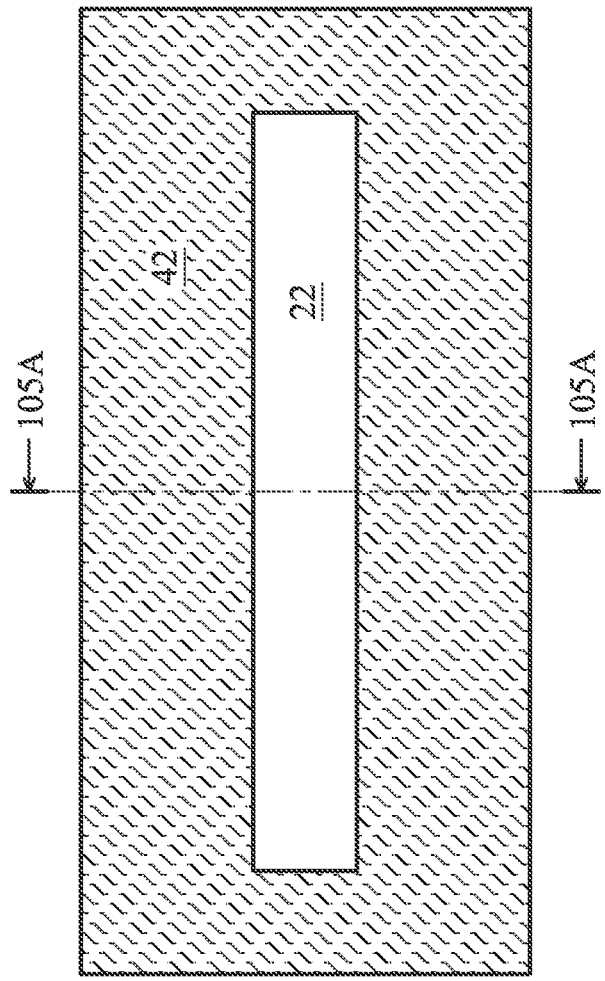
Figure 5A:
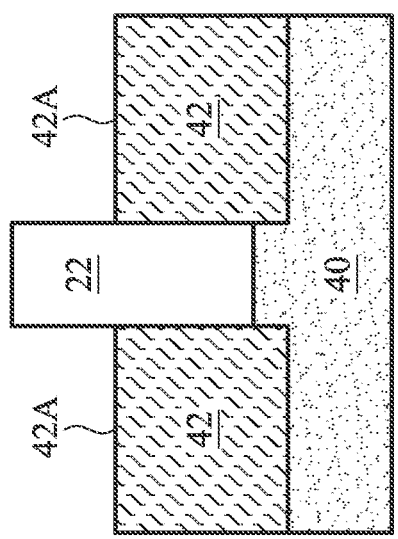

Next, as shown in FIG. 5A, top portions of STI regions 42 are removed, and top surfaces 42A of STI regions 42 are lowered. As a result, a portion of channel splitter 22 is higher than top surfaces 42A of STI regions 42. FIG. 5B illustrates a top view of the structure in FIG. 4A, wherein the cross-sectional view in FIG. 5A is obtained from the plane crossing line 105A-105A in FIG. 5B.

FIG. 6 illustrates an alternative embodiment, wherein channel splitter 22 is formed by patterning a layer 23, which comprises the same material as channel splitter 22. In the patterning for forming channel splitter 22, the dashed portions of layer 23 are removed in the patterning step, and a remaining portion of layer 23 forms channel splitter 22. Although substrate 40 is illustrated as being underlying layer 23, in alternative embodiments, channel splitter 22 is patterned from a bulk substrate. In such embodiments, there is no substrate 40 underlying layer 23, and layer 23 is a bulk substrate.

In a subsequent process step, as shown in FIGS. 7A and 7B, an epitaxy is performed to epitaxially grow narrow-bandgap material 124 on the top surface and sidewalls of channel splitter 22. FIG. 7B illustrates a top view of the structure shown in FIG. 7A. Since narrow-bandgap material 124 is formed by epitaxy, the thickness Tch/2 of narrow-bandgap material 124 may be controlled to be, for example, smaller than about 2 nm, or between about 1 nm and about 3 nm.

Figure 8B:
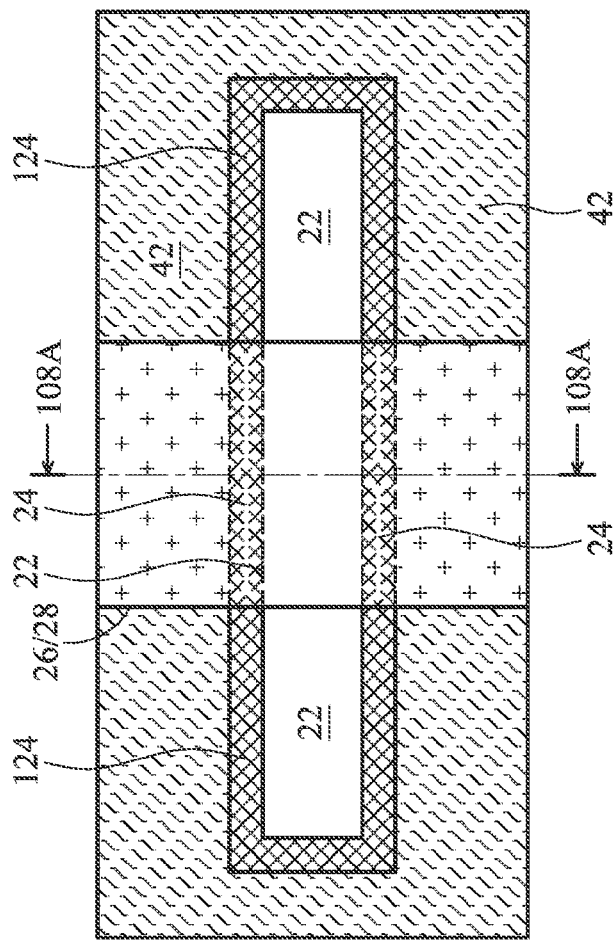
Figure 8A:
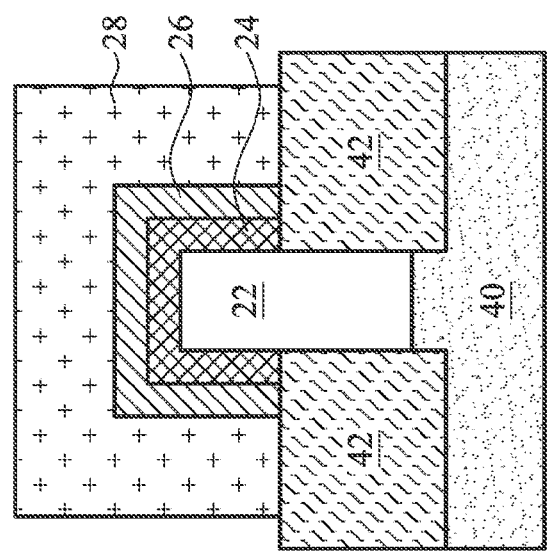

FIGS. 8A and 8B illustrate a cross-sectional view and a top view, respectively, of the formation of gate insulator 26 and gate electrode 28. The cross-sectional view in FIG. 8A is obtained from the plane crossing line 108A-108A in FIG. 8B. The formation process may include forming a blanket dielectric layer over the structure shown in FIGS. 7A and 7B, forming a blanket gate electrode layer over the blanket dielectric layer, and then patterning the blanket dielectric layer and the blanket gate electrode layer to form gate insulator 26 and gate electrode 28, respectively. The portions of narrow-bandgap material 124 covered by gate electrode 28 thus form channel portions 24 as shown in FIGS. 1A and 2. In subsequent process steps, as shown in FIG. 2A, sidewall spacers 34, drain region 30, source region 32, drain contact 36, and source contact 38 are formed. Sidewall spacers 34 may be formed first by depositing a dielectric layer(s), and then performing an anisotropic etch on the dielectric layer. Drain region 30 and source region 32 are then formed by implanting an impurity into portions of channel splitter 22 and narrow-bandgap material 124 (FIG. 8B), which portions are not covered by gate electrode 28. In subsequent steps, inter-layer dielectric (ILD, not shown), drain contact 36, and source contact 38 (FIG. 2) that are in the ILD are formed.

Figure 10:
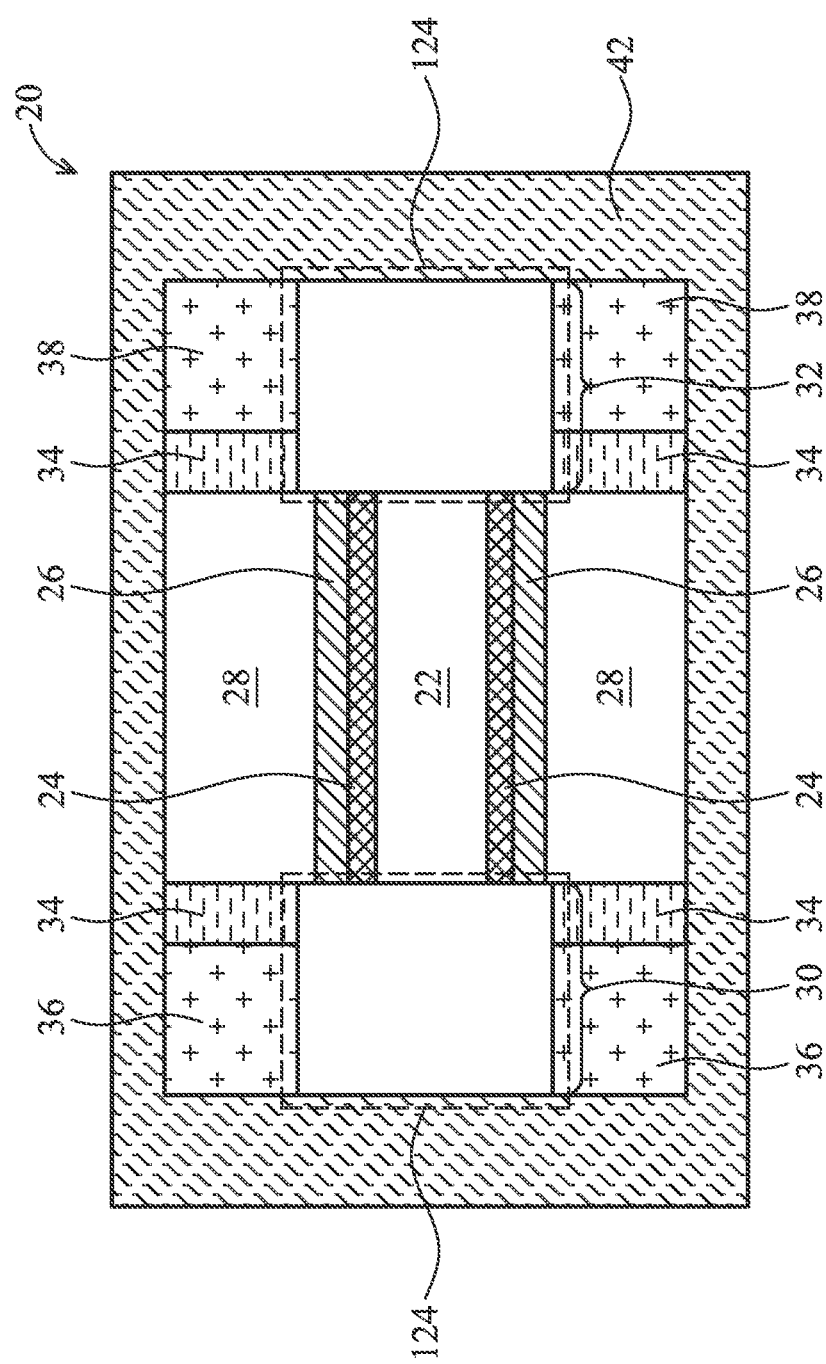

FIGS. 9 and 10 illustrate top views of intermediate stages in the formation of FinFET 20. The initial process steps are essentially the same as what are shown in FIGS. 3 through 7B. Next, the structure as shown in FIG. 9 is formed. This structure is similar to the structure in the step shown in FIG. 8B, except gate electrode 28 covers substantially an entirety of channel splitter 22. Next, as shown in FIG. 10, before the formation of sidewall spacers 34, an epitaxy is performed to expand narrow-bandgap material 124, wherein the expanded portions of narrow-bandgap material 124 are selectively grown starting from narrow-bandgap material 124 in FIG. 9. The expanded portions of narrow-bandgap material 124 may comprise the same III-V compound semiconductor material as the original narrow-bandgap material 124 in FIG. 9. Alternatively, the expanded portions of narrow-bandgap material 124 may comprise different III-V compound semiconductor materials than the original narrow-bandgap material 124 in FIG. 9.

Next, similar to what are shown in FIG. 1A, sidewall spacers 34 are formed. An implantation is then performed to dope an impurity into drain region 30 and source region 32 to p-type or n-type, depending on whether the resulting FinFET 20 is a p-type FinFET or an n-type FinFET. Drain contact 36 and source contact 38 are then formed. The resulting FinFET is similar to FinFET 20 shown in FIG. 1A, except that drain region 30 and source region 32 are wider in the direction perpendicular to the source-to-drain direction.

Figure 11:
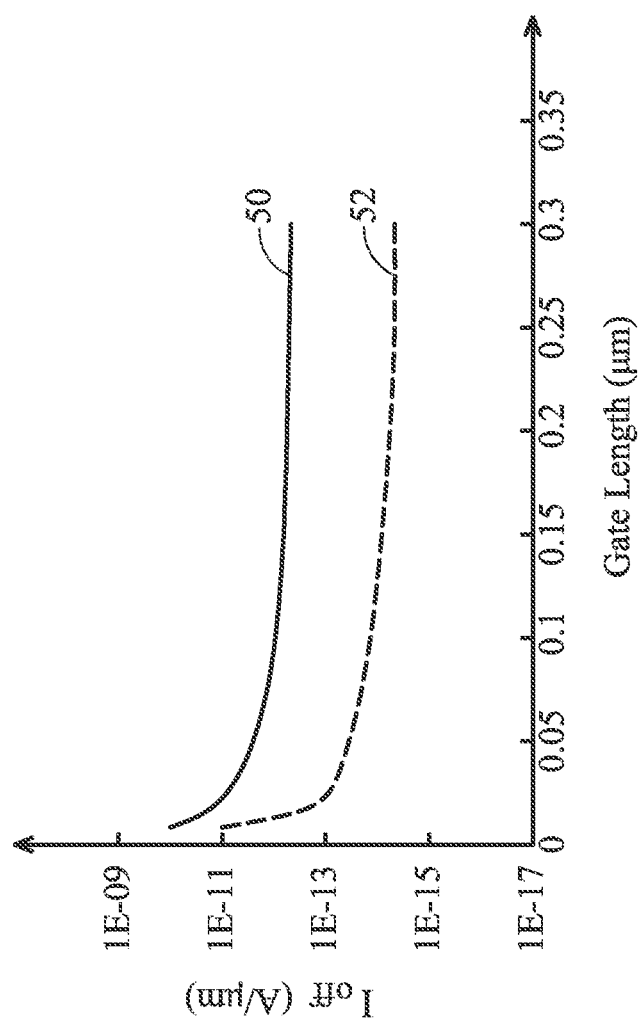
FIG. 11 illustrates leakages currents of FinFETs as a function of gate lengths, in accordance with some embodiments.

Through the formation of channel splitter 22, which has a greater bandgap than channel 24, the leakage current Ioff of the resulting FinFET 20 may be reduced. FIG. 11 illustrates the simulation results, wherein the leakage currents Ioff of FinFETs are illustrated as a function of gate lengths. Line 50 is obtained by simulating the device behavior of a FinFET with a homogenous channel comprising InAs, while line 52 is obtained by simulating the device behavior of FinFET comprising channel splitter 22. Channel splitter 22 comprises $AlAs_{0.16}Sb_{0.84}$, and is disposed between channels formed of InAs. By forming channel splitter 22, leakage currents Ioff may be reduced by about 2 orders compared to the FinFET with the homogenous InAs channel.

FIGS. 12A through 16B illustrate hybrid FinFETs in accordance with alternative embodiments. Unless specified otherwise, the materials and formation methods of the components in these embodiments are the same as the like components, which are denoted by like reference numerals in the embodiments shown in FIGS. 1 through 10. The details of the like components shown in FIGS. 12A through 16B may thus be found in the discussion of the embodiments shown in FIGS. 1 through 10.

Figure 12A:
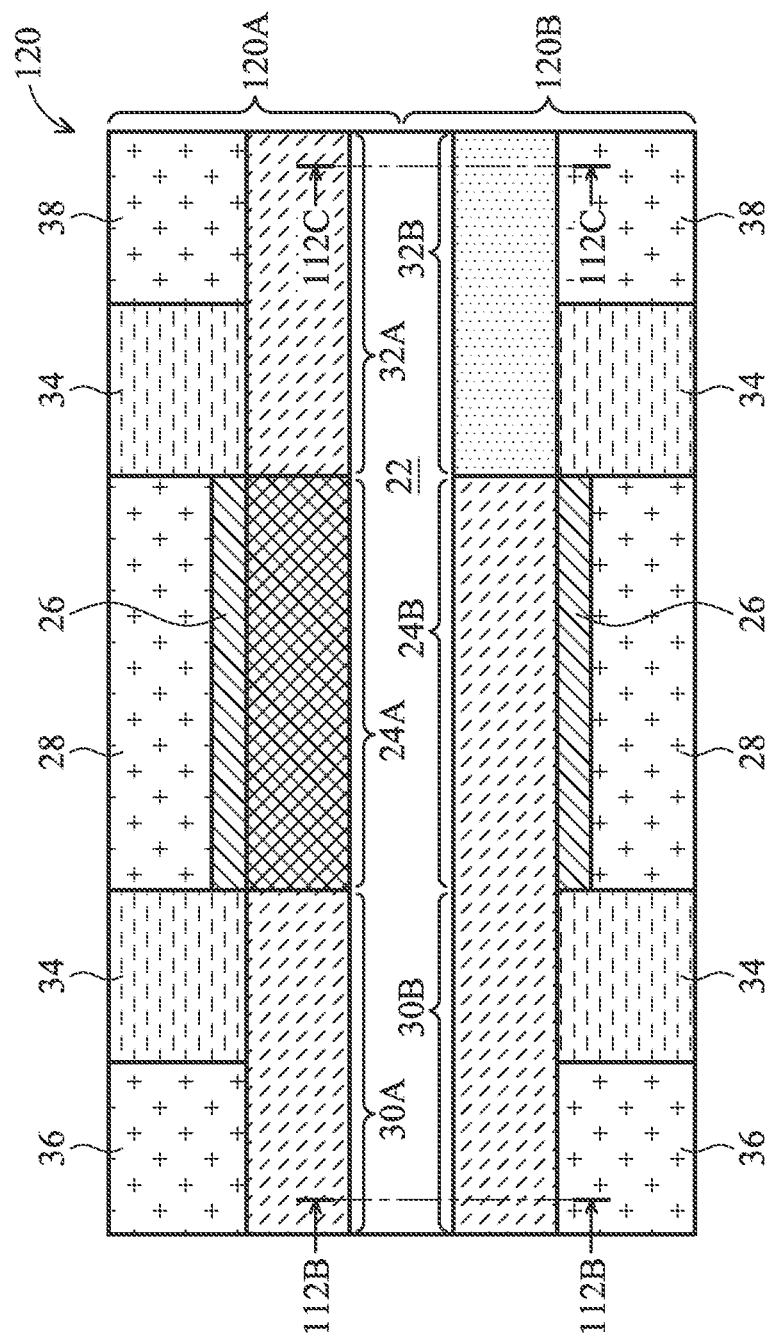
FIGS. 12A, 12B, and 12C illustrate the top view and cross-sectional views of a hybrid FinFET comprising a channel splitter, in accordance with some embodiments.

Referring to FIG. 12A, which is a top view of FinFET 20 in accordance with some exemplary embodiments, hybrid FinFET 120 includes channel splitter 22, which separates channel portions 24A from channel portion 24B. Gate insulator 26, gate spacers 34, drain contact 36, and source contact 38 are also formed as parts of FinFET 20. On opposite ends of channel portion 24A are drain region 30A and source region 32A. On opposite ends of channel portion 24B are drain region 30B and source region 32B. The formation materials of drain regions 30A and 30B and source regions 32A and 32B may be the same as that of drain region 30 and source region 32 in FIGS. 1A and 2, except the conductivity type of source region 32B may be opposite to the conductivity type of drain regions 30A and 30B and source region 32A. The formation methods and material of channel regions 22 in FIG. 12A are the same as the formation methods and the material of channel region 22 in the embodiments shown in FIGS. 1 through 10.

Hybrid FinFET 120 includes two transistors that are connected in parallel, and share the same channel splitter 22, drain contact 36, and source contact 38. The first transistor is denoted as 120A, which includes drain region 30A, channel region 24A, source region 32A, gate insulator 26, and gate electrode 28. FinFET 120A is a MOSFET whose source and drain regions are of the same type. The second transistor is denoted as 120B, which is a tunnel FET whose drain region 30B and source region 32B are of different conductivity types. Tunnel FET 120B includes drain region 30B, channel portion 4B, source region 32B, gate insulator 26, and gate electrode 28.

In some exemplary embodiments, hybrid FinFET 120 is an n-type FinFET. Accordingly, drain regions 30A and 30B are of n-type. Source region 32A is of n-type, and source region 32B is of p-type. Channel portion 24A may be intrinsic (not doped) or may be of p-type. Channel portion 24B may be intrinsic or may be of n-type. Accordingly, hybrid FinFET 120 includes n-type MOSFET 120A and n-type tunnel FET 120B connected in parallel.

In alternative embodiments, hybrid FinFET 120 is a p-type FinFET. Accordingly, drain regions 30A and 30B are of p-type. Source region 32A is of p-type, and source region 32B is of n-type. Channel region 24B may be intrinsic or may be of p-type. Accordingly, hybrid FinFET 120 includes p-type MOSFET 120A and p-type tunnel FET 120B connected in parallel.

Figure 12C:
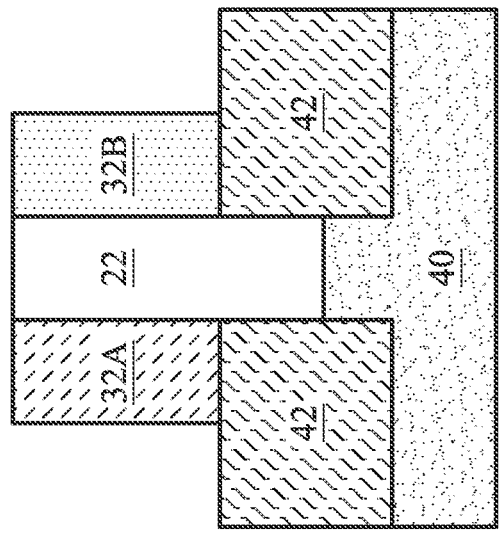
Figure 12B:
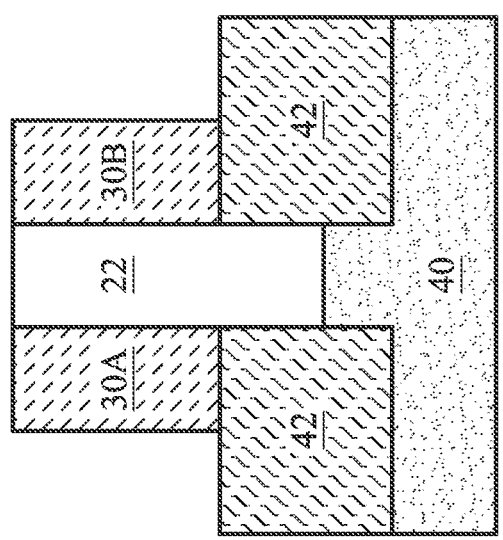

FIGS. 12B and 12C illustrate cross-sectional views of hybrid FinFET 120, wherein the cross-sectional views are obtained from the planes crossing lines 112B-112B and 112C-112C in FIG. 12A, respectively. In FIG. 12B, it is shown that drain regions 30A and 30B, which are of the same conductivity type, are separated from each other by channel splitter 22, which has a greater bandgap than drain regions 30A and 30B. Drain regions 30A and 30B may further have their sidewalls contacting the opposite sidewalls of channel splitter 22. Furthermore, the top surfaces of drain regions 30A and 30B may be substantially level with the top surface of channel splitter 22. In FIG. 12C, it is shown that source regions 32A and 32B, which are of opposite conductivity types, are separated from each other by channel splitter 22. Source regions 32A and 32B may further have their sidewalls contacting the opposite sidewalls of channel splitter 22. Furthermore, the top surfaces of source regions 32A and 32B may be substantially level with the top surface of channel splitter 22.

The formation process of FinFET 120 may be similar to what are shown in FIGS. 3 through 10, except different doping steps may be taken to dope source region 32B to a conductivity type different from the conductivity type of regions 30A, 30B, and 32A. Furthermore, channel region 24A may be doped separately to achieve the desirable doping concentration; hence the threshold voltage of FinFET 120A can be adjusted.

Figure 13:
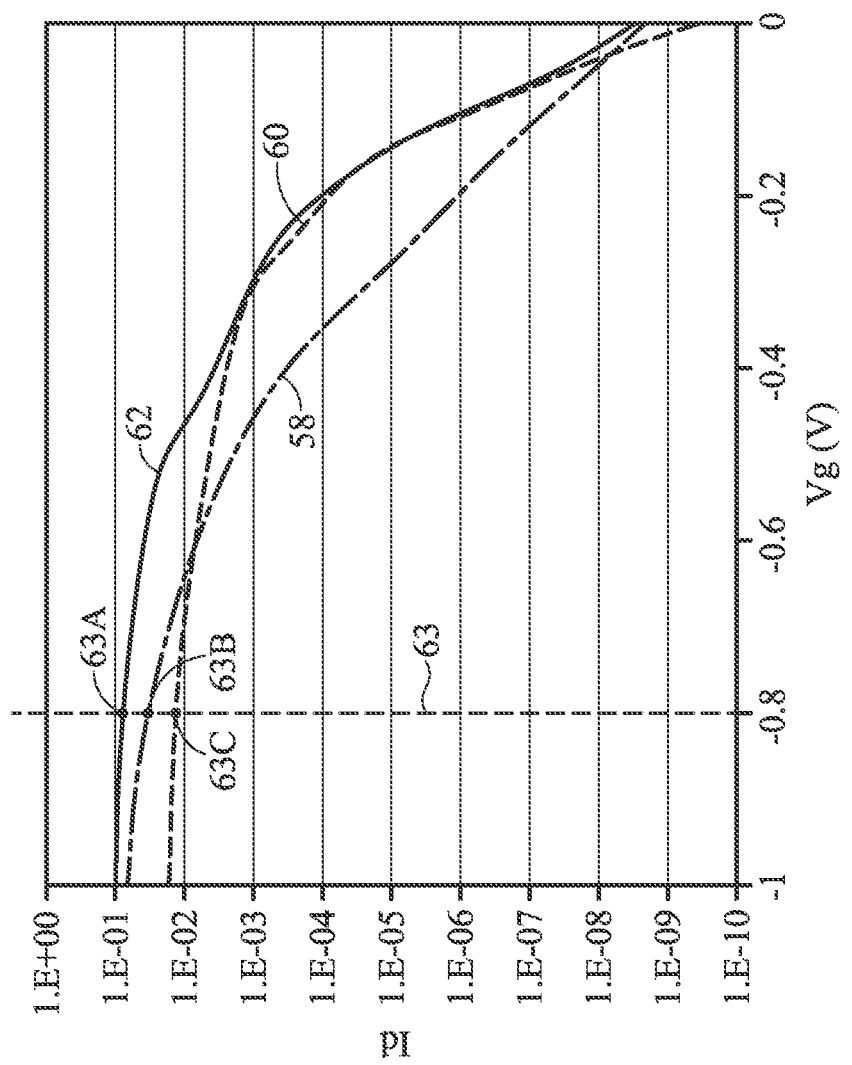
FIGS. 13 and 14 illustrate simulation results of a p-type hybrid FinFET and an n-type hybrid FinFET, respectively, in accordance with some embodiments.

FIG. 13 illustrates simulation results, wherein on-currents Id of the simulated p-type transistors are illustrated as a function of gate voltages Vg. Lines 58, 60, and 62 are simulated from p-type FinFETs 120A and 120B (FIG. 12A), and p-type hybrid transistor 120, respectively. It is observed that the on-current (line 62) of the hybrid FinFET 120 is higher than the on-currents 58 and 60 of both FinFETs 120A and 120B. This may be found, for example, by drawing a vertical line (for example, line 63) where gate voltage Vg has a magnitude high enough to turn on the respective FinFET 120, 120A, and 120B (for example, with voltage Vg being about −0.8V). Line 63 intercepts lines 62, 58, and 60 at points 63A, 63B, and 63C, respectively. It is observed that the current (the on-current of hybrid FinFET 120) at point 63A is higher than the currents (the on-current of FinFETs 120A and 120B) at points 63B and 63C. Furthermore, it is observed that the slope of hybrid FinFET 120 is also high since the current 62 of hybrid FinFET 120 rises quickly with the increasing in the magnitude of the gate voltage Vg. When comparing lines 62 with lines 58 and 60, it is found that hybrid FinFET 120 combines the advantageous features of MOSFET 120A and tunnel FET 120B, which advantageous features include the high on-current of MOSFET 120A and the low swing of tunnel FET 120B. Furthermore, the threshold voltage of hybrid FinFET 120 may be adjusted by adjusting the doping concentration in channel region 24A in FIG. 12A.

Figure 14:
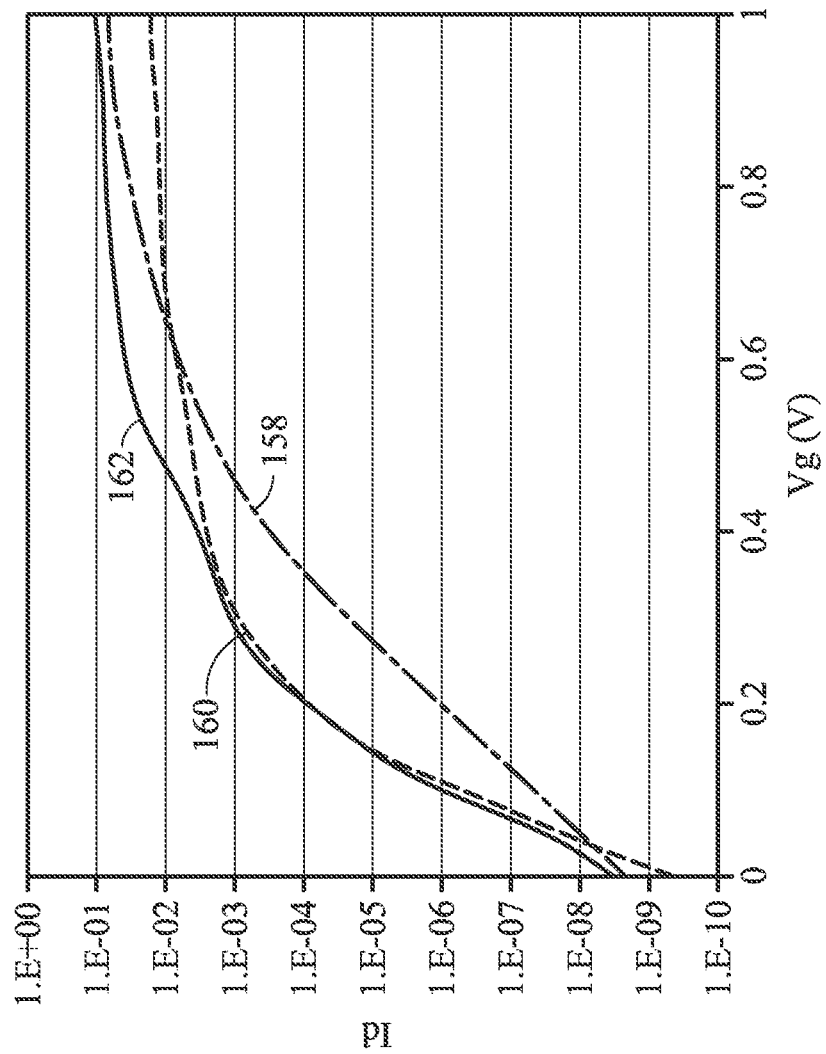

FIG. 14 illustrates the simulation results similar to the results of FIG. 13, except that n-type FETs are used for obtaining the results in FIG. 14. In FIG. 14, Lines 158, 160, and 162 are simulated from n-type MOSFET 120A, n-type tunnel FET 120B, and n-type hybrid MOSFET 120, respectively. Again, FIG. 14 reveals that the n-type hybrid FinFET 120 also combines the advantageous features, including the high on-current of MOSFET 120A and high swing of tunnel FET 120B.

Figure 15A:
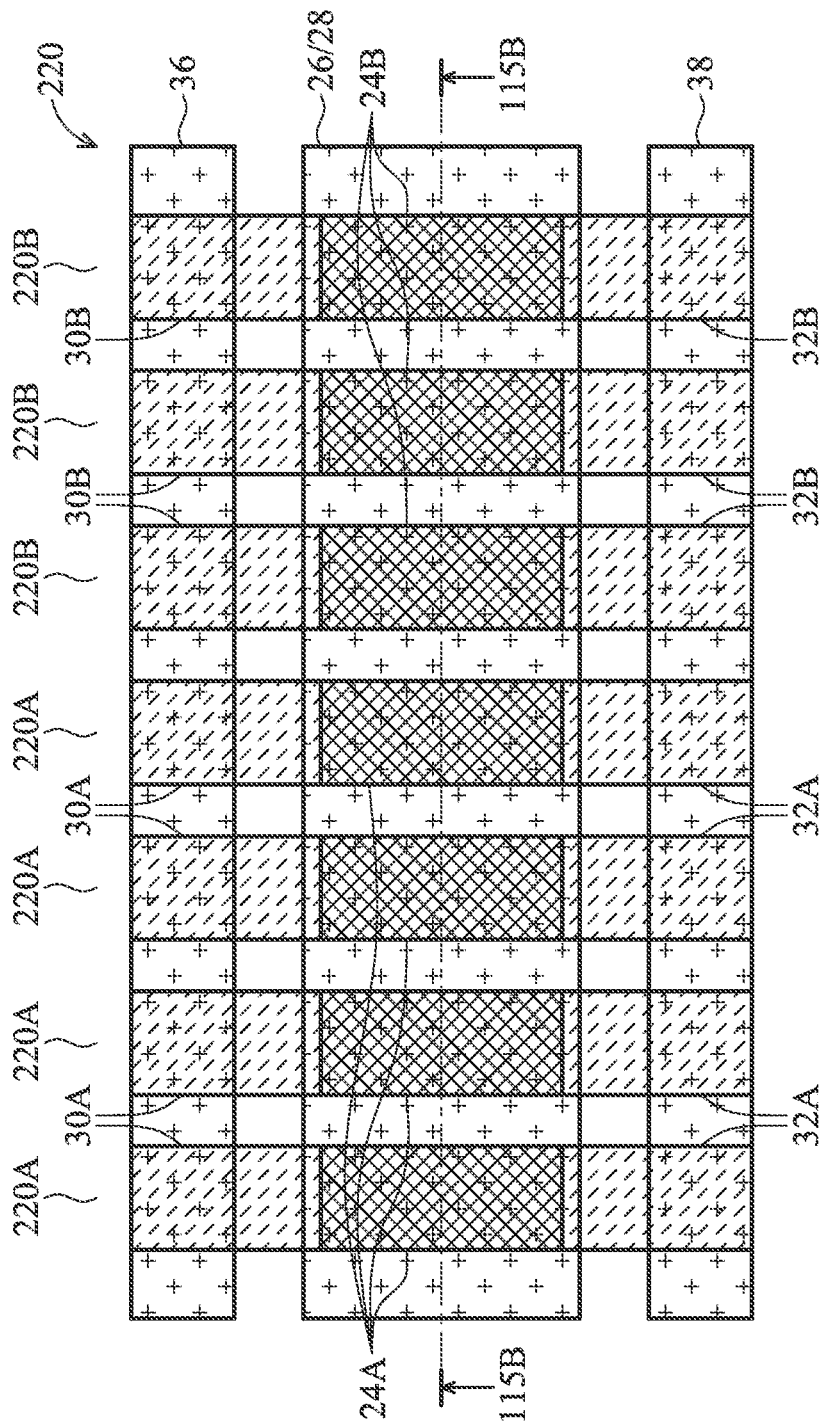
FIGS. 15A through 16B illustrate the top views and cross-sectional views of hybrid FinFETs in accordance with alternative embodiments.
Figure 15B:
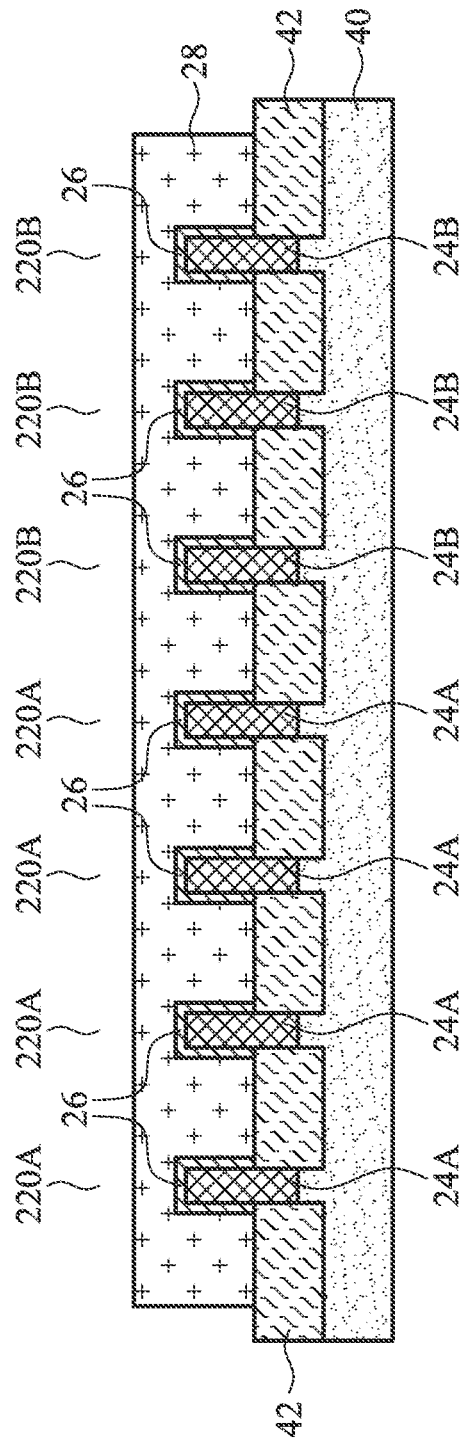

FIGS. 15A and 15B illustrate a top view and a cross-sectional view, respectively, of hybrid FinFET 220 in accordance with alternative embodiments. The cross-sectional view in FIG. 15B is obtained from the plane crossing line 115B-115B in FIG. 15A. In these embodiments, no channel splitter is adopted. Instead, FinFET 220 includes one or a plurality of FinFETs 220A connected in parallel with one or a plurality of tunnel FinFETs 220B. For example, when FinFET 220A is connected in parallel with FinFETs 220B, the gate of FinFET 220A is connected to the gates of FinFETs 220B, the source of FinFET 220A is connected to the sources of FinFETs 220B, and the drain of FinFET 220A is connected to the drains of FinFETs 220B. FinFETs 220A have homogeneous channels 24A that do not have layers or sub regions formed of different materials. FinFETs 220B have homogeneous channels 24B that do not have layers or sub regions formed of different materials. Each of FinFETs 220A and 220B includes a semiconductor fin (either 24A or 24B), and gate insulator 26 and gate electrode 28 (FIG. 15B) on the opposite sidewalls of fin 24A/24B. FinFETs 220A and 220B may be dual-gate FinFETs (similar to what is shown in FIG. 1C), wherein gate insulators 26 and gate electrode 28 do not extend to the top surfaces of the respective fins 24A/24B. As shown in FIG. 15B, FinFETs 120A and 120B may also be tri-gate FinFETs, wherein gate insulators 26 and gate electrode 28 extend over the top surfaces of the respective fins 24A/24B. Neighboring fins 24A and 24B are separated from other by the portions of gate electrode 28 inserted therebetween, and by the portions of gate insulator 26 therebetween.

Referring again to FIG. 15A, FinFETs 220A are MOSFETs whose drain regions 30A and source regions 32A are of the same conductivity type. FinFETs 220B are tunnel FinFETs whose drain regions 30B and source regions 32A are of opposite conductivity types. Drain regions 30B are of the same conductivity type as drain regions 30A and source regions 32A. Source regions 32B are of an opposite conductivity type than the conductivity type of drain regions 30B. Common drain contact 36 may be used to interconnect, and may be in physical contact with, drain regions 30A and 30B. Common source contact 38 may be used to interconnect, and may be in physical contact with, source regions 32A and 32B. Common gate electrode 28 is shared by FinFETs 220A and 220B.

FinFETs 220A and 220B in hybrid FinFET 220 are of a same conductivity type, which may be either p-type or n-type. When FinFETs 220A are of p-type, drain regions 30A and source regions 32A are of p-type. When FinFETs 220A are of n-type, drain regions 30A and source regions 32A are of n-type. When tunnel FinFETs 120B are of p-type, drain regions 30B and source regions 32B are of p-type and n-type, respectively. When tunnel FinFETs 220B are of n-type, drain regions 30B and source region 32B are of n-type and p-type, respectively.

The total number of FinFETs 220A and the total number of tunnel FETs 220B may be any integer equal to or greater than 1. By adjusting the numbers of FinFETs 220A and 220B comprised in hybrid FinFET 220, the characteristic of the resulting hybrid FinFET 220 may be adjusted. For example, by increasing the number of FinFETs 220A, the on-current of hybrid FinFET 220 may be increased, although the leakage current may also be increased. Conversely, by increasing the number of FinFETs 220B in hybrid FinFET 220, a lower leakage current of hybrid FinFET 220 may be achieved, although the on-current may be sacrificed. Therefore, the characteristic of hybrid FinFET 220 may be adjusted to suit to different needs.

In FIGS. 15A and 15B, FinFETs 220A as a group are laid out on a same side of the group formed of FinFETs 120B. In alternative embodiments, FinFETs 220A and FinFETs 220B may be allocated in any other layout configuration. For example, FinFETs 220A and 220B may be allocated alternatingly, with the layout of 220A, 220B, 220A, 220B, 220A . . . etc. The different layout configurations of FinFETs 220A and 220B are in the scope of the present application.

Figure 16A:
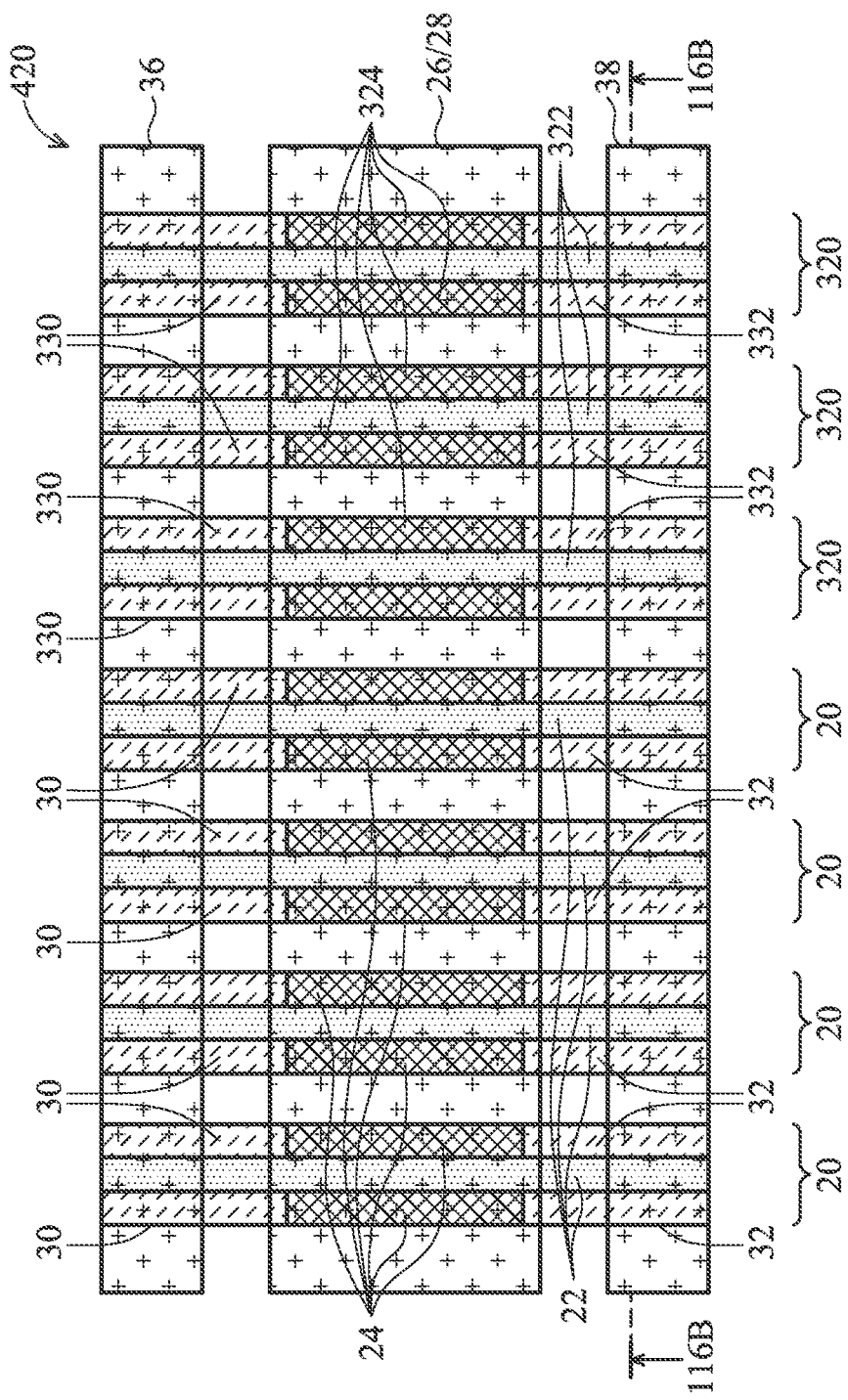
Figure 16B:
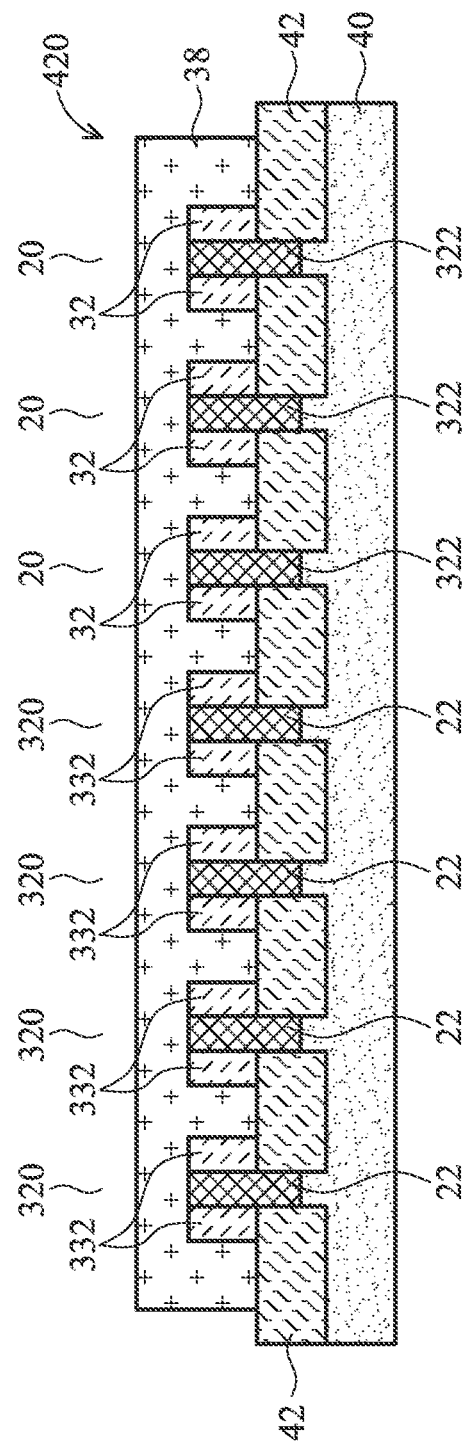

FIGS. 16A and 16B illustrate a top view and a cross-sectional view of hybrid FinFET 420 in accordance with alternative embodiments. The cross-sectional view in FIG. 16B is obtained from the plane crossing line 116B-116B in FIG. 16A. In these embodiments, a plurality of FinFETs 20, each having the structure in FIGS. 1A or 2 is connected in parallel with tunnel FinFETs 320. The drain regions 30 of FinFETs 20 and drain regions 330 of FinFETs 320 are connected to the common source contact 36, and are of a same conductivity type. The source regions 32 of FinFETs 20 and source regions 332 of tunnel FinFETs 320 are connected to the common source contact 38. Source regions 32 are of the same conductivity type as drain regions 30, and source regions 332 are of the opposite conductivity type than that of drain regions 330 and source regions 32.

Each of FinFETs 20 and tunnel FinFETs 320 includes a channel splitter, which is denoted as 22 and 322, respectively. Channel splitter 322 may have a bandgap greater than the bandgap of drain regions 330 and source regions 332. The semiconductor materials for forming drain regions 330, channel splitters 322, channels 324, and source regions 322 may be similar to that of drain regions 30, channel splitters 22, channels 24, and source regions 32 as in FIGS. 1A and 2.

In accordance with embodiments, a hybrid FinFET includes a first and a second FinFET. The first FinFET includes a first channel region formed of a first semiconductor fin, a first gate insulator on a sidewall of the first channel region, a first gate electrode over the first gate insulator, and a first source region and a first drain region of a first conductivity type. The second FinFET includes a second channel region formed of a second semiconductor fin, a second gate insulator on a sidewall of the second channel region, a second gate electrode over the second gate insulator, a second source region of a second conductivity type opposite the first conductivity type, and a second drain region of the first conductivity type. The second source region and the second drain region are connected to opposite ends of the second channel region. The first and the second gate electrodes are interconnected. The first and the second source regions are electrically interconnected. The first and the second drain regions are electrically interconnected.

In accordance with other embodiments, a hybrid FinFET includes a fin, a drain, and a source. The fin includes a channel splitter having a first bandgap, and a channel including a first portion and a second portion on opposite sidewalls of the channel splitter. The channel has a second bandgap different from the first bandgap. The drain includes a first portion and a second portion of a first conductivity type. The source includes a first portion of the first conductivity type, wherein the first portion of the source and the first portion of the drain are on a first side of the channel splitter, and are connected to opposite ends of the first portion of the channel. The source further includes a second portion of a second conductivity type opposite the first conductivity type, wherein the second portion of the source and the second portion of the drain are on a second side of the channel splitter opposite the first side, and are connected to opposite ends of the second portion of the channel.

In accordance with yet other embodiments, a device includes a first and a second FinFET. The first FinFET includes a first channel region formed of a first semiconductor fin, a first gate insulator on opposite sidewalls of the first channel region, a first gate electrode over the first gate insulator, and a first source region and a first drain region connected to opposite ends of the first channel region. The first source region and the first drain region are of a first conductivity type. The second FinFET includes a second channel region formed of a second semiconductor fin, a second gate insulator on opposite sidewalls of the second channel region, a second gate electrode over the second gate insulator, a second source region of a second conductivity type opposite the first conductivity type, and a second drain region of the first conductivity type. The second source region and the second drain region are connected to opposite ends of the second channel region. The first and the second source regions are electrically interconnected. The first and the second drain regions are electrically interconnected. The first and the second gate electrodes are interconnected. The first and the second semiconductor fins are homogenous.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first Fin Field-Effect Transistor (FinFET) comprising:
a first channel region formed of a first semiconductor fin;
a first gate insulator on a sidewall of the first channel region;
a first gate electrode over the first gate insulator; and
a first source region and a first drain region connected to opposite ends of the first channel region, wherein the first source region and the first drain region are of a first conductivity type; and
a second FinFET comprising:
a second channel region formed of a second semiconductor fin;
a second gate insulator on a sidewall of the second channel region;
a second gate electrode over the second gate insulator, wherein the first and the second gate electrodes are interconnected;
a second source region of a second conductivity type opposite the first conductivity type, wherein the first and the second source regions are electrically interconnected; and
a second drain region of the first conductivity type, wherein the second source region and the second drain region are connected to opposite ends of the second channel region, and wherein the first and the second drain regions are electrically interconnected.

2. The device of claim 1, wherein the first and the second gate electrodes are portions of a continuous gate electrode, and wherein the device further comprises:
a common source contact interconnecting the first source region and the second source region; and
a common drain contact interconnecting the first drain region and the second drain region.

3. The device of claim 1 further comprising a channel splitter comprising a semiconductor material, wherein the first and the second channel regions are in contact with opposite sidewalls of the channel splitter, and wherein the channel splitter is formed of a material different from materials of the first and the second channel regions.

4. The device of claim 3, wherein the channel splitter has a bandgap greater than bandgaps of the first and the second channel regions.

5. The device of claim 3, wherein each of the channel splitter and the first and the second channel regions comprises a III-V compound semiconductor material.

6. The device of claim 1:
wherein the first FinFET further comprises:
a first channel splitter; and
a third source region, wherein the first and the third source region are in contact with opposite sides of the channel splitter, and are of the first conductivity type; and
wherein the second FinFET further comprises:
a second channel splitter; and
a fourth channel region, wherein the second and the fourth source regions are in contact with opposite sidewalls of the second channel splitter, and are of the second conductivity type.

7. The device of claim 1, wherein each of the first FinFET and the second FinFET comprises homogeneous channels.

8. A hybrid Fin Field-Effect Transistor (FinFET) comprising:
a fin comprising:
a channel splitter having a first bandgap; and
a channel comprising a first portion and a second portion on opposite sidewalls of the channel splitter, wherein the channel has a second bandgap different from the first bandgap;
a drain comprising a first portion and a second portion of a first conductivity type; and
a source comprising:
a first portion of the first conductivity type, wherein the first portion of the source and the first portion of the drain are on a first side of the channel splitter, and are connected to opposite ends of the first portion of the channel; and
a second portion of a second conductivity type opposite the first conductivity type, wherein the second portion of the source and the second portion of the drain are on a second side of the channel splitter opposite the first side, and are connected to opposite ends of the second portion of the channel.

9. The hybrid FinFET of claim 8 further comprising:
a gate electrode comprising a first portion and a second portion on opposite sides of the fin; and
a gate insulator comprising a first portion between the first portion of the gate electrode and the first portion of the channel, and a second portion between the second portion of the gate electrode and the second portion of the channel.

10. The hybrid FinFET of claim 8 further comprising:
a source contact electrically connected to the first portion and the second portion of the source; and
a drain contact electrically connected to the first portion and the second portion of the drain.

11. The hybrid FinFET of claim 8, wherein the channel splitter and the channel comprise III-V compound semiconductor materials.

12. The hybrid FinFET of claim 8, wherein the channel splitter has a bandgap greater than a bandgap of the channel.

13. The hybrid FinFET of claim 8, wherein the first conductivity type is n-type, and the second conductivity type is p-type.

14. The hybrid FinFET of claim 8, wherein the first conductivity type is p-type, and the second conductivity type is n-type.

15. A device comprising:
a first Fin Field-Effect Transistor (FinFET) comprising:
  a first channel region formed of a first semiconductor fin, wherein the first semiconductor fin is homogenous;
  a first gate insulator on opposite sidewalls of the first channel region;
  a first gate electrode over the first gate insulator ; and
  a first source region and a first drain region connected to opposite ends of the first channel region, wherein the first source region and the first drain region are of a first conductivity type; and
a second FinFET comprising:
  a second channel region formed of a second semiconductor fin, wherein the second semiconductor fin is homogenous;
  a second gate insulator on opposite sidewalls of the second channel region;
  a second gate electrode over the second gate insulator, wherein the first and the second gate electrodes are interconnected; and
  a second source region of a second conductivity type opposite the first conductivity type, wherein the first and the second source regions are electrically interconnected; and
  a second drain region of the first conductivity type, wherein the second source region and the second drain region are connected to opposite ends of the second channel region, and wherein the first and the second drain regions are electrically interconnected.

16. The device of claim 15, wherein the first and the second gate electrodes are portions of a continuous gate electrode, and wherein the device further comprises:
  a source contact interconnecting the first source region and the second source region; and
  a drain contact interconnecting the first drain region and the second drain region.

17. The device of claim 16, wherein the first and the second channel regions are separated from each other, with a portion of the continuous gate electrode disposed between, and at a same level as, the first and the second semiconductor fins.

18. The device of claim 15 further comprising a third FinFET connected in parallel with the first and the second FinFETs, wherein the third FinFET has a substantially same structure as the first FinFET.

19. The device of claim 15 further comprising a third FinFET connected in parallel with the first and the second FinFETs, wherein the third FinFET has a substantially same structure as the second FinFET.

20. The device of claim 15, wherein the first and the second source regions are connected to a same source contact, and wherein the first and the second drain regions are connected to a same drain contact.

* * * * *